(12) United States Patent
Birner et al.

(10) Patent No.: US 9,269,807 B2
(45) Date of Patent: Feb. 23, 2016

(54) SEMICONDUCTOR DEVICE AND METHOD OF MAKING THE SAME

(71) Applicant: Infineon Technologies AG, Neubiberg (DE)

(72) Inventors: Albert Birner, Regensburg (DE); Helmut Brech, Lappersdorf (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/716,200

(22) Filed: May 19, 2015

(65) Prior Publication Data

US 2015/0255597 A1    Sep. 10, 2015

Related U.S. Application Data

(62) Division of application No. 13/584,581, filed on Aug. 13, 2012, now Pat. No. 9,064,796.

(51) Int. Cl.

| H01L 29/10 | (2006.01) |
|---|---|
| H01L 29/78 | (2006.01) |
| H01L 21/265 | (2006.01) |
| H01L 29/66 | (2006.01) |
| H01L 29/08 | (2006.01) |
| H01L 29/161 | (2006.01) |

(Continued)

(52) U.S. Cl.
CPC ...... *H01L 29/7816* (2013.01); *H01L 21/26506* (2013.01); *H01L 29/04* (2013.01); *H01L 29/0847* (2013.01); *H01L 29/1083* (2013.01); *H01L 29/1095* (2013.01); *H01L 29/161* (2013.01); *H01L 29/167* (2013.01); *H01L 29/66659* (2013.01); *H01L 29/7835* (2013.01); *H01L 21/26586* (2013.01); *H01L 29/402* (2013.01); *H01L 29/4175* (2013.01)

(58) Field of Classification Search
CPC ............... H01L 29/1083; H01L 29/66659; H01L 29/4175; H01L 29/7837; H01L 29/7838
See application file for complete search history.

(56) References Cited

U.S. PATENT DOCUMENTS

| 5,378,901 A | 1/1995 | Nii |
|---|---|---|
| 6,358,807 B1 | 3/2002 | Chyan et al. |

(Continued)

FOREIGN PATENT DOCUMENTS

JP    2000216168 A    8/2000

OTHER PUBLICATIONS

El Mubarek et al. ("Reduction of Boron Diffusion in Silicon—Germanium by Fluorine Implantation." IEEE Electron Device Letters. vol. 25, No. 8, Aug. 2004).*

(Continued)

*Primary Examiner* — Cheung Lee
*Assistant Examiner* — Stephen Bradley
(74) *Attorney, Agent, or Firm* — Slater & Matsil, L.L.P.

(57) ABSTRACT

A semiconductor device includes a drift region in a first region of a semiconductor body. The drift region includes dopants of a first conductivity type. A dopant retarding region is formed at least adjacent an edge of the drift region. Dopants of a second conductivity type are implanted into the semiconductor body. The semiconductor body is annealed to form a body region so that dopants of the second conductivity type are driven into the semiconductor body at a first diffusion rate. The dopant retarding region prevents the dopants from diffusing into the drift region at the first diffusion rate.

19 Claims, 7 Drawing Sheets

(51) Int. Cl.
*H01L 29/167* (2006.01)
*H01L 29/04* (2006.01)
*H01L 29/40* (2006.01)
*H01L 29/417* (2006.01)

(56) References Cited

U.S. PATENT DOCUMENTS

| | | | |
|---|---|---|---|
| 6,465,870 B2 | 10/2002 | Voldman | |
| 6,534,371 B2 | 3/2003 | Coolbaugh et al. | |
| 6,878,976 B2 | 4/2005 | Coolbaugh et al. | |
| 7,371,648 B2 | 5/2008 | Chen et al. | |
| 7,420,228 B2 | 9/2008 | Bock et al. | |
| 7,608,515 B2* | 10/2009 | Chen et al. | 438/297 |
| 7,626,233 B2 | 12/2009 | Tornblad et al. | |
| 7,799,623 B2 | 9/2010 | Yamada | |
| 7,902,576 B2 | 3/2011 | Chakravarthi et al. | |
| 7,989,879 B2 | 8/2011 | Van Rijs et al. | |
| 8,294,210 B2* | 10/2012 | Kocon et al. | 257/337 |
| 2002/0003286 A1 | 1/2002 | Marty et al. | |
| 2002/0096742 A1 | 7/2002 | Voldman | |
| 2002/0121676 A1 | 9/2002 | Chu et al. | |
| 2002/0151153 A1 | 10/2002 | Drobny et al. | |
| 2002/0177253 A1 | 11/2002 | Johnson et al. | |
| 2003/0042480 A1 | 3/2003 | Hirose | |
| 2003/0082882 A1 | 5/2003 | Babcock et al. | |
| 2003/0207542 A1 | 11/2003 | Chidambaram et al. | |
| 2004/0031970 A1 | 2/2004 | Chakravarthi et al. | |
| 2006/0113592 A1 | 6/2006 | Pendharkar et al. | |
| 2008/0261359 A1 | 10/2008 | Arnborg et al. | |
| 2008/0308904 A1 | 12/2008 | Chidambaram et al. | |
| 2009/0045459 A1 | 2/2009 | Okabe | |
| 2009/0050980 A1 | 2/2009 | Ekbote et al. | |
| 2009/0146180 A1 | 6/2009 | Huang et al. | |
| 2010/0096697 A1 | 4/2010 | Su et al. | |
| 2010/0102386 A1 | 4/2010 | You | |
| 2012/0091469 A1 | 4/2012 | Park et al. | |
| 2013/0105892 A1* | 5/2013 | Ren et al. | 257/335 |

OTHER PUBLICATIONS

Chakravarthi, S., et al., "Process Modeling Based on Atomistic Understanding for State of the Art CMOS Device Design," Silicon Technology Department, vol. 2003, pp. 121-124.
Diebel, M., et al., "Investigation and modeling of fluorine co-implantation effects on dopant redistribution," Materials Research Society, 2003, pp. D6.15.1-D615.6.
Jain, S. C., et al., "Transient enhanced diffusion of boron in Si," Journal of Applied Physics, Applied Physics Reviews, vol. 91, No. 11, Jun. 1, 2002, pp. 8919-8941.
Lopez, G. M., et al., "Fluorine in Si: Native-defect complexes and the suppression of impurity diffusion," Physical Review B 72, Jul. 22, 2005, pp. 045219-1-045219-7.
El Mubarek, H. A. W., et al., "Reduction of Boron Diffusion in Silicon—Germanium by Fluorine Implantation," IEEE Electron Device Letters, vol. 25, No. 8, Aug. 2004, pp. 535-537.
El Mubarek, H. A. W., et al., Effect of fluorine implantation dose on boron thermal diffusion in silicon, Jounal of Applied Physics, vol. 96, No. 8, Oct. 15, 2004, pp. 4114-4121.
El Mubarek, H. A. W. El, et al., "Reduction of boron thermal diffusion in silicon by high energy fluorine implantation," Applied Physics Letters, vol. 83, No. 20, Nov. 17, 2003, pp. 4134-4136.
"Process Modeling Based on Atomistic Understanding for State of the Art CMOS Device Design," Silicon Technology Department, Nanotech 2003, vol. 2, pp. 121-124.
Nishikawa, S., et al., "Reduction of transient boron diffusion in preamorphized Si by carbon implantation," Applied Physics Letters, vol. 60, No. 18, May 4, 1992, pp. 2270-2272.
Stolk, P.A., et al., "Carbon incorporation in silicon for suppressing interstitial-enhanced boron diffusion," Applied Physics Letters, vol. 66, No. 11, Mar. 13, 1995, pp. 1370-1372.

* cited by examiner

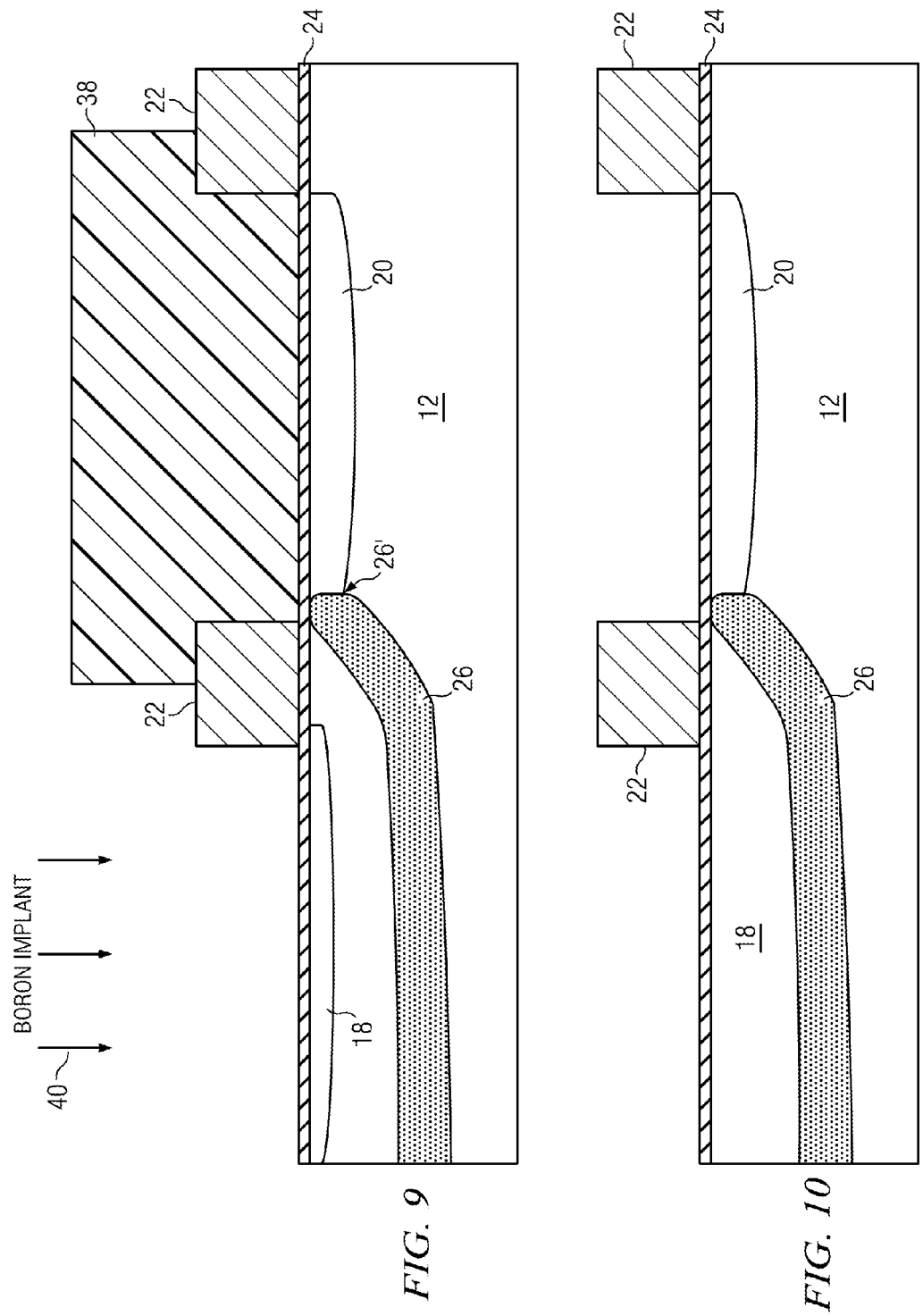

SEMICONDUCTOR DEVICE AND METHOD OF MAKING THE SAME

The present invention is a divisional of application Ser. No. 13/584,581 filed on Aug. 13, 2012, which is incorporated herein by reference.

TECHNICAL FIELD

The present invention relates generally to semiconductor devices and methods and, in particular embodiments, to a power semiconductor device and method of making the same.

BACKGROUND

Semiconductor devices are used in a large number of applications including computers, mobile phones and most other electronic devices. For example, transistors can be used as switching devices to implement logic circuits. One of the goals in designing such transistors is to make the individual devices small, fast and power efficient. These goals are especially important in mobile applications where users want to be able to carry devices that implement a large number of tasks and use as little of the battery as possible.

One type of semiconductor device is a power transistor. A power transistor is designed to be able to carry relatively large amounts of current without being damaged. Such devices are typically larger than the logic transistors used to implement processor circuits but are able to withstand power levels that would harm the smaller devices. For example, a power transistor may be used to drive an electric device such as a DC motor.

One type of power transistor is a laterally diffused metal oxide semiconductor (LDMOS) transistor. LDMOS transistors can be used in a number of applications such as in RF/microwave power amplifiers, e.g., for base-stations that require high output power. Accordingly, LDMOS technology is effectively the dominant device technology used in high power RF amplifiers for frequencies ranging from 700 MHz to 3.8 GHz.

SUMMARY OF THE INVENTION

The present invention provides a number of embodiments and variations. In one embodiment, a semiconductor device includes a drift region in a first region of a semiconductor body. The drift region includes dopants of a first conductivity type. A dopant retarding region is formed at least adjacent an edge of the drift region. Dopants of a second conductivity type are implanted into the semiconductor body. The semiconductor body is annealed to form a body region so that dopants of the second conductivity type are driven into the semiconductor body at a first diffusion rate. The dopant retarding region prevents the dopants from diffusing into the drift region at the first diffusion rate.

Another embodiment provides a power transistor device. A source region of a first conductivity type is disposed in a semiconductor body and a drain region of the first conductivity type is disposed in the semiconductor body and spaced from the source region. A drift region of the first conductivity type is disposed in the semiconductor body adjacent the drain region between the source and drain regions. A channel region of a second conductivity type is disposed in the semiconductor body adjacent the drift region between the drift region and the source region. A dopant retarding region is disposed in the semiconductor body between the drift region and the channel region. The dopant retarding region is doped with a material such as carbon, nitrogen or fluorine. A gate at least partially overlies the channel region and is insulated therefrom.

BRIEF DESCRIPTION OF THE DRAWINGS

For a more complete understanding of the present invention, and the advantages thereof, reference is now made to the following descriptions taken in conjunction with the accompanying drawing, in which:

FIGS. 7-10 illustrate a second embodiment method of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an LDMOS transistor. The invention may also be applied, however, to other power transistors and semiconductor devices that exhibit similar issues.

In one aspect, the present invention provides a technique for applying a selective diffusion retarding agent that is capable of blocking the diffusion of a dopant into or around a region that should remain free of such dopants. In one example, as will be described below, boron will be blocked from diffusing into neighboring n-type regions. As will be clear to one of ordinary skill in the art, the concepts described here can be utilized in other situations as well.

Figure 1:
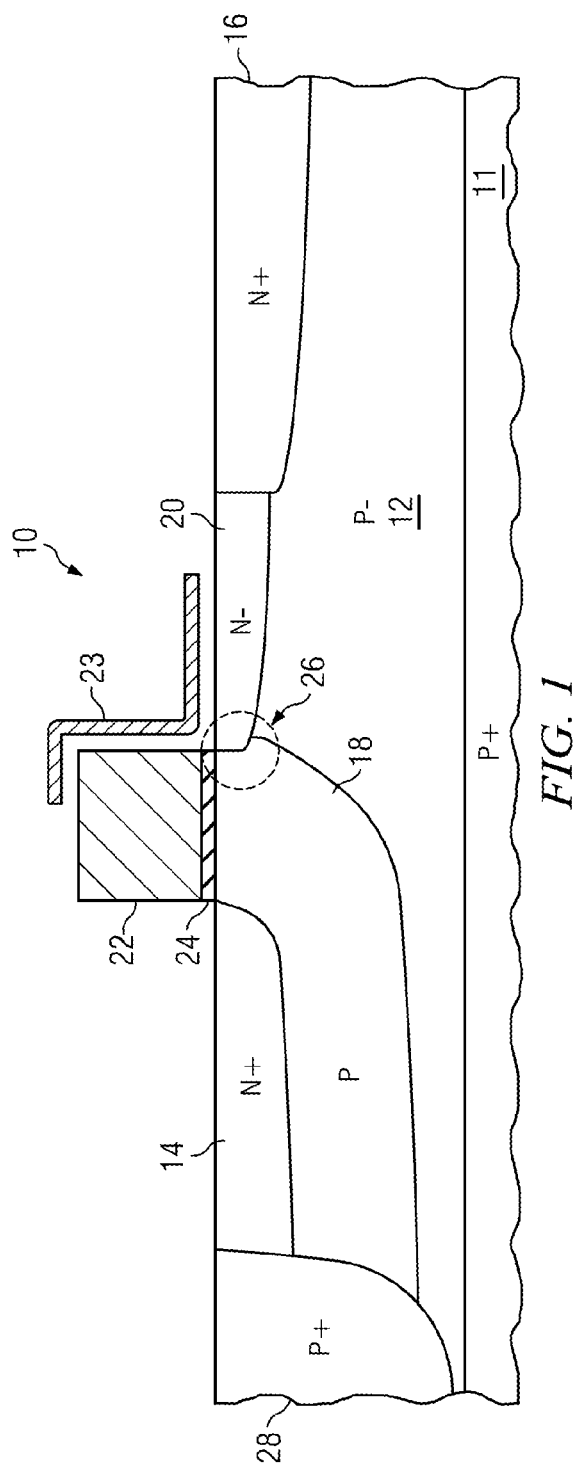
FIG. 1 is a cross-sectional view of a power transistor of an embodiment of the present invention.

FIG. 1 illustrates a first embodiment semiconductor device. In particular, the invention will now be described in the context of one example, namely an LDMOS transistor. FIG. 1 illustrates a portion of such a transistor 10 that can implement concepts of the present invention.

The semiconductor device 10 is formed in a semiconductor body 12. This region can be a bulk semiconductor substrate or a layer on or within a substrate. For example, semiconductor body 12 can be monocrystalline silicon, e.g., formed as an epitaxially grown layer. This region 12 can be lightly doped, either n-type or p-type, or alternatively can be intrinsic. In the illustrated example of a NMOS transistor, a p-doped epitaxial region 12 is formed over a p+ bulk silicon region 11. In general, adjacent p- and n-doped wells or junctions are provided for which interdiffusion of dopants of one type into the zones of complementary doping type is not desirable.

A number of doped regions are formed within the semiconductor body 12. In operation, a current path will be formed between the source region 14 and the drain region 16. The source and drain regions 14 and 16 are heavily doped, in this case with n-type dopants such as arsenic or phosphorus. In other embodiments, the doping concentrations of all of the regions can be reversed. In a typical embodiment, the doping concentration of the source and drain regions is between about $1\times10^{20}$ cm$^{-3}$ and about $1\times10^{21}$ cm$^{-3}$.

An optional sinker region 28 is formed in the semiconductor body 12. As shown in FIG. 1, the sinker region 28 is located at an edge of the source 14 that is distant from the drain region 16. The sinker region is heavily doped with p-type dopants in the illustrated example. For example, the sinker region 28 can have a doping concentration of boron that is between about $1 \times 10^{17}$ cm$^{-3}$ and about $1 \times 10^{21}$ cm$^{-3}$.

A region 18 is formed between the source and drain regions 14 and 16 and doped to an opposite conductivity type. The region 18 can be referred to as a well region or a body region, as examples, and serves as the channel between the source and drain regions. In this case, the channel region 18 is doped with p-type dopants such as boron. The channel region is typically doped with a lower doping concentration such as between about $1 \times 10^{15}$ cm$^{-3}$ and about $3 \times 10^{18}$ cm$^{-3}$.

A gate 22 overlies the channel region 18 between the source and drain regions. The gate 22 is typically a conductive region such as doped semiconductor (e.g., polysilicon) or a metal or combinations of both. The gate 22 is electrically insulated from the underlying semiconductor region by a gate insulating layer 24. This insulating layer 24 can be an oxide (e.g., silicon dioxide), a nitride (e.g., silicon nitride), an oxynitride (e.g., silicon oxynitride), or a "high-k" dielectric.

The device 10 can also include a shield 23, which extends, for example, from a top surface of the gate electrode 22 and over at least a portion of the drift region 20. The shield 23 is insulated from the underlying structure and can be made of any conducting material, e.g., the same material as the gate 22.

As shown in FIG. 1, the drain region includes an extension region or drift region 20. The region 20 is also sometimes referred to as a lightly doped drain or LDD. The drift region 20 is formed with the same conductivity type dopant as the drain region 16 but with a lower doping concentration. For example, the drift region 20 may have a doping concentration between about $3 \times 10^{16}$ cm$^{-3}$ and about $3 \times 10^{18}$ cm$^{-3}$ of the same dopants as in drain regions 16, e.g., arsenic or phosphorus.

In designing the device 10, the transistor properties are tailored by placing the p-type (e.g., boron) and n-type (e.g., arsenic, phosphorous) dopants at well-defined doping levels and doping gradients into source and drain junctions as well as transistor body 18 and transistor drift 20. In intrinsic silicon at 1000° C., diffusivities of boron, phosphorous and arsenic vary around $10^{-14}$ cm$^2$/s for boron and $10^{-15}$ cm$^2$/s for phosphorous and arsenic. Theses diffusivities can be altered by orders of magnitude if impurities such as interstitials and vacancies are present to undergo pair propagation with one of the dopant species. For example, these defects can be created during the implantation process.

In the case of boron, the defects would predominantly be formed by interstitial silicon. For arsenic, silicon vacancies would act as the predominant diffusion enhancer. Power devices in particular are formed using diffusion processes with huge thermal budget in order to drive boron over ranges of micrometers or to create p-doped sinkers or lateral diffusion for the creation of drift regions to sustain excessive electric fields or to fulfill certain ruggedness of reliability aspects. For example, an NMOS transistor with two n-doped junctions (e.g., source 14 and drain 16) may be laterally boron diffused to improve its hot carrier stability.

One issue in the technology is that it is difficult to prohibit the n-doped zones from becoming co-doped with boron atoms in a situation where the diffusion of boron intermixes with a diffusion of arsenic or phosphorous. One embodiment of the invention provides a technique to avoid the unintentional co-doping of n-type junctions during intentional diffusion of boron. For example, during post-implant thermal treatment, the co-diffusion can be tailored or even avoided.

In one embodiment, the invention addresses these issues by applying a diffusion retarder for boron diffusion to or around an n-doped region or to a region where n-type dopant is to diffuse but p-type dopant is not. Implementation of this concept is illustrated in FIG. 1, which includes a dopant retarding region 26 located between the n-doped drift region 20 and the p-doped channel region 18. This additional region can be a region doped with a diffusion retarder material such as carbon or fluorine. Boron-interstitial pairs diffusing at higher rates towards such junctions would be stopped by the diffusion retarder as the retarder would getter the interstitial.

In the illustrated example, the region 26 is located at the boundary between and p- and n-doped regions 18 and 20. This region can be across the boundary or in either one of the adjacent regions. The retarding region 26 might have a dopant concentration of between about $1 \times 10^{18}$ cm$^{-3}$ and about $1 \times 10^{20}$ cm$^{-1}$.

Figure 2:
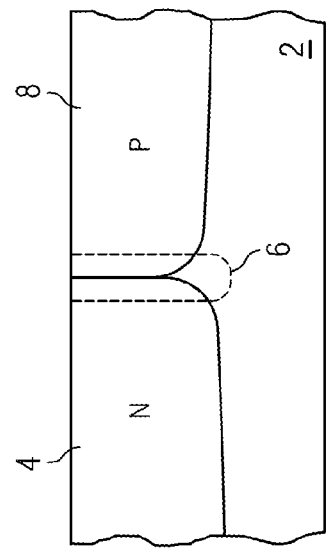
FIG. 2 is a cross-sectional view of a dopant retarding region of an embodiment of the present invention.

A more generalized view of an embodiment of the invention is shown in FIG. 2. In this example, a boron-doped p-type region 8 is adjacent an n-type region 4, which may be doped with arsenic or phosphorus. These regions are formed in a semiconductor body 2, which may be monocrystalline silicon, for example. The retarding region 6 is between the regions 4 and 8 and be doped with a diffusion retarding material such as carbon or fluorine. As discussed with the specific example of FIG. 1, the n- and p-type regions 4 and 8 can be a drift region (20) and a channel region (18) of an LDMOS transistor. In other embodiments, the regions can be portions of other devices, such as NMOS and PMOS transistors for logic, Flash and memory (e.g., DRAM).

The implementation of embodiments of the present invention will now be described with respect to two different embodiments. The first embodiment is illustrated with respect to FIGS. 3-6 and the second embodiment with respect to FIGS. 7-10. Both embodiments illustrate the formation of a portion of an LDMOS transistor. As discussed herein, the inventive concepts can be used in other situations as well.

Figure 3:
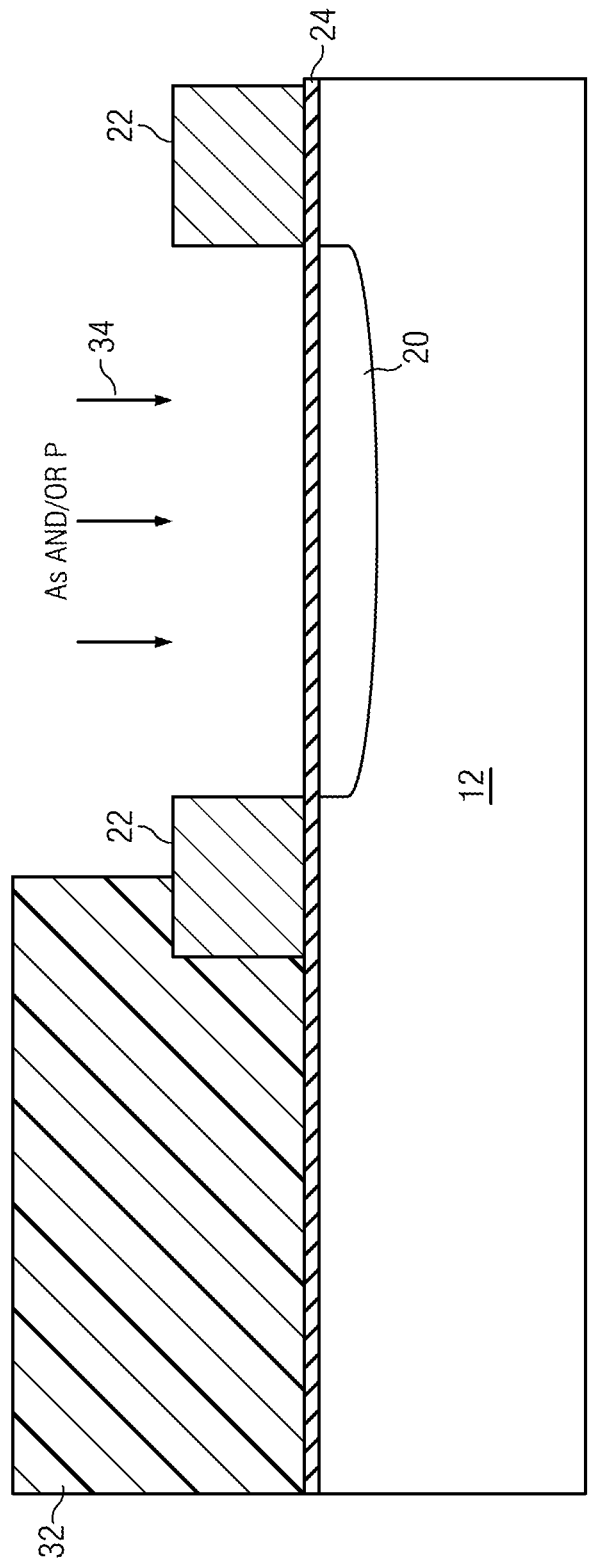
FIGS. 3-6 illustrate a first embodiment method of the present invention.

FIG. 3 illustrates a partially fabricated structure that will be used as the starting point for this discussion. In this structure, the gate electrode 22 and gate insulating region 24 have already been formed. This figure shows a portion of a pair of transistors of the same kind having a common drain region. The drain will be formed in the center of the drift region 20 and spaced from both gates 22. In one example, the final structure will be like the structure of FIG. 1, with a mirror image relative to a line perpendicular to the substrate surface and through the drain 16.

In order to form the drift region 20, a first mask 32 is formed to cover the source region of the device. The mask 32 can be any photoresist that is patterned to expose the desired regions. As illustrated by reference numeral 34, the drift dopants, in this case arsenic, are implemented into the exposed portion of the semiconductor body 12.

Figure 4:
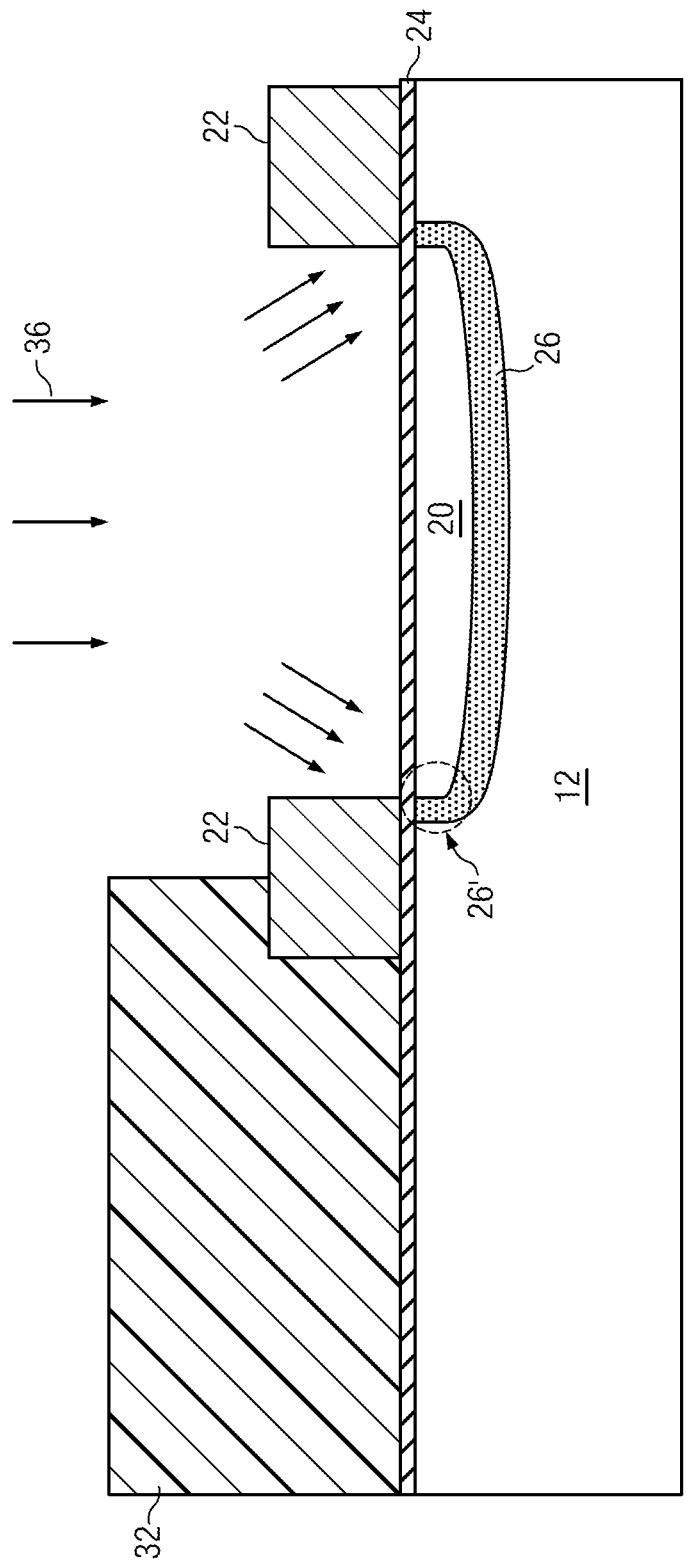

FIG. 4 illustrates a process for forming the dopant retarding region 26. As shown in the figure, a dopant retarding material 36 is implanted into the portion of the semiconductor body 12 that has been exposed by a mask 32. The dopant retarding material could be fluorine or carbon or nitrogen atoms or others. Carbon is used in the illustrated example. A typical implantation dose is around $3 \times 10^{14}$ cm$^{-2}$, e.g., ranging from about $1 \times 10^{13}$ cm$^{-2}$ up to about $1 \times 10^{16}$ cm$^{-2}$. The implant energy is tailored in such a way that the diffusion retarder becomes located at or around the region that shall be protected from boron diffusion. For example, the implant energy can range from about 30 keV to about 800 keV. The implantation angle can be substantially 0° or tilted at, e.g., about 30-60°, or a combination of both.

Implantation of the diffusion retarder 36 can be done before or after implantation of the n-type region 20 that is to be protected from boron diffusion. In the embodiment of FIG. 4, the carbon is introduced by implantation using the same resist mask with the n-type dopant. The diffusion retarder may be applied by implantation or incorporated during silicon epitaxy or MOCVD or MOVPE or from a gaseous phase.

In NMOS transistors, the diffusion retardation region 26 would be placed in or around the n-regions to be protected (e.g., LDD region 20) or specifically in a region 26' between p-region 18 and the n-region 20 to be protected from boron doping under thermal treatment. In PMOS transistors the diffusion retarder could also be placed in an n-region, e.g., the channel. In particular PMOS transistors having highly boron-doped junctions can be eased from short-channel effects and roll-off by preventing boron from diffusion into the channel with the help of the method described above.

Figures 5, 6:
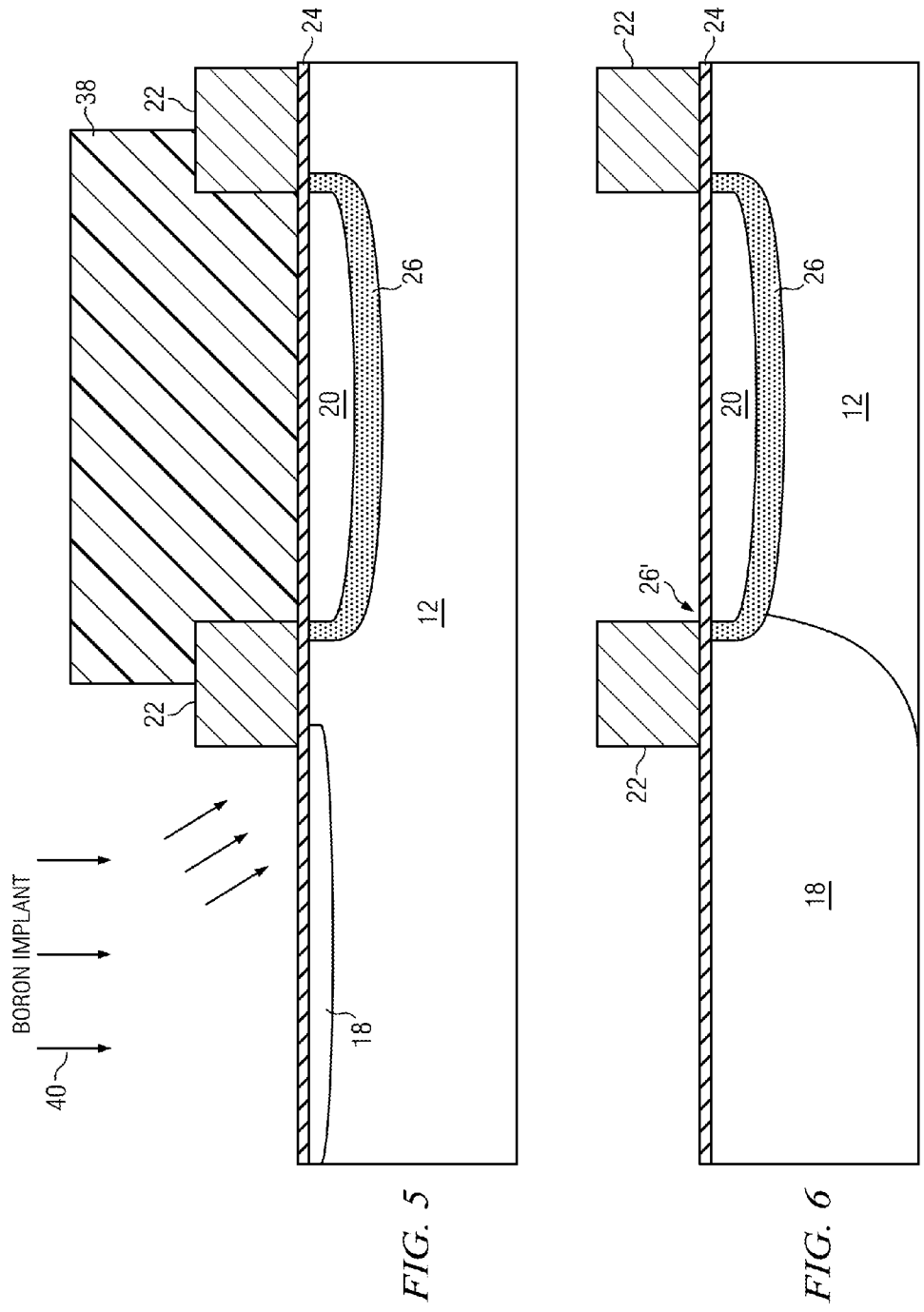

Referring now to FIG. 5, the mask 32 is removed and a second mask 38 is formed. The mask 38 covers the drain side and exposes the source side of the device. As illustrated in FIG. 5, a p-type dopant such as boron 40 can be implanted into the source side of the device. The implantation angle can be substantially 0° or tilted at, e.g., about 30-60°, or a combination of both. This implantation 40 will provide the dopants for creating the body region 18.

FIG. 6 illustrates the thermal anneal that is used to drive in the dopants. This drive-in process will form the lateral boron dopant gradient under the gate. The boron diffusion will be retarded or even stopped in the carbon rich zone 26 around the LDD region 20. In a typical case, the thermal anneal will be performed at a temperature ranging from about 850° C. to about 1050° C. for a time ranging from about 10 min to about 120 min.

In this step, the semiconductor body 12 is annealed to form a body region 18 so that p-dopants (e.g., boron) are driven into the semiconductor body 12 at a given diffusion rate. The dopant retarding region 26 prevents the dopants from diffusing into the drift region 20 at that same diffusion rate. For example, the dopant retarding region 26 might cause the dopants to diffuse into the drift region 20 at a diffusion rate that is at least an order of magnitude less than the given diffusion rate. In one example, the diffusion is stopped completely or nearly completely. In other words, the dopant retarding region 26 prevents the dopants from diffusing into the drift region 20 so that substantially no p-dopants are diffused into the drift region 20.

The structure of FIG. 1 can now be completed, e.g., with the formation of the source and drain regions 14 and 16 and the sinker region 28. These regions are formed using standard processes and will not be described further herein.

Figure 7:
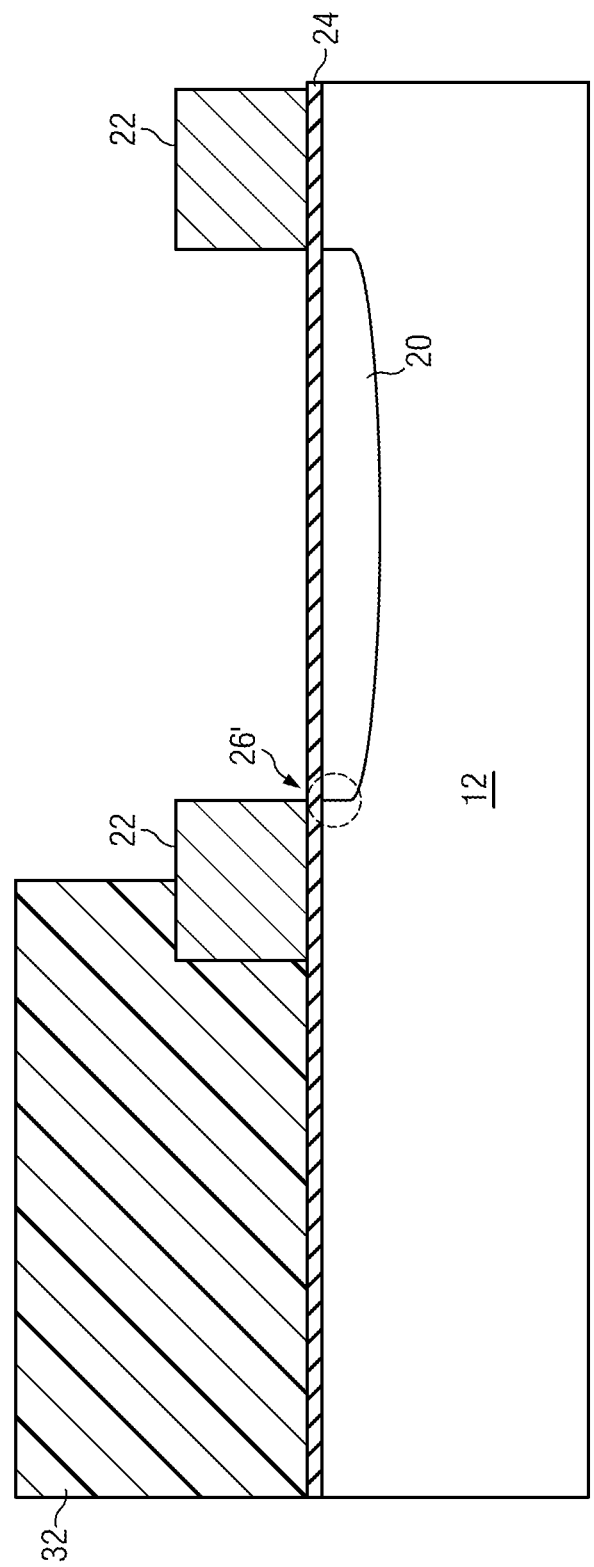

A second method embodiment will now be described with respect to FIGS. 7-10. While the first embodiment illustrated a drain-side implantation process for the dopant retarder, this embodiment will illustrate a source-side implantation process. FIG. 7 illustrates a starting point that is similar to FIG. 3. As before, the drift region 20 is formed by implantation of arsenic into the semiconductor body 12. Once again, the process will form a phase retarding region 26' at an edge of the drift region 20 adjacent the gate 22.

Figure 8:
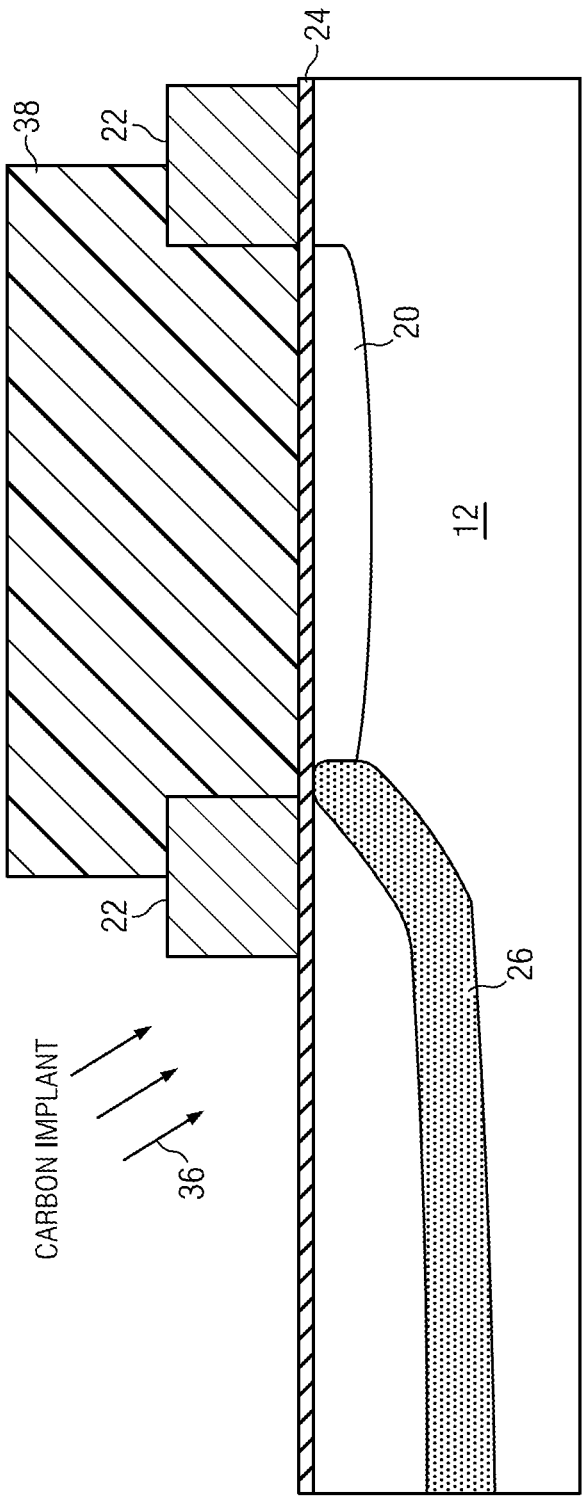

Referring now to FIG. 8, the dopant retarding internal can be formed in the semiconductor body 12. In the illustrated example, a deep/tilted carbon implantation is performed to create a carbon-rich zone 26 in the gate-to-drain overlap zone. Once again, the dopant retarding material is present at least at the junction between the and n-doped region 20 and the p-doped region 18. For this step, a typical implantation dose is around $4\times10^{14}$ cm$^{-2}$, e.g., ranging from about $3\times10^{13}$ cm$^{-2}$ up to about $1\times10^{16}$ cm$^{-2}$, a typical implant energy can range from about 100 keV to about 1200 keV, and a typical implantation angle can range from about 10° to about 70°.

As illustrated in FIG. 9, the p-type dopant is implanted using the same mask 38. This process may be similar to the one described with respect to FIG. 5. As before, the boron implant 40 can be performed before or after the carbon implant 36.

The drive-in process to form the lateral boron dopant gradient under the gate is illustrated in FIG. 10. Accordingly, the structure of FIG. 10 is similar to that of FIG. 6 in that the dopant retarding region 26 extends to the junction region 26'between the regions 18 and 20. The boron diffusion will be retarded or even stopped in the carbon rich zone 26 around the body region 18.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power transistor comprising:
   a semiconductor body;
   a source region of a first conductivity type disposed in the semiconductor body;
   a drain region of the first conductivity type disposed in the semiconductor body and spaced from the source region;
   a drift region of the first conductivity type disposed in the semiconductor body adjacent the drain region between the source and drain regions;
   a channel region of a second conductivity type disposed in the semiconductor body adjacent the drift region between the drift region and the source region;
   a dopant retarding region disposed in the semiconductor body between the drift region and the channel region, the dopant retarding region doped with a material selected from the group consisting of carbon, nitrogen and fluorine, wherein either the drift region is bounded by the dopant retarding region and the channel region is not bounded by the dopant retarding region or the channel region is bounded by the dopant retarding region and the drift region is not bounded by the dopant retarding region; and
   a gate at least partially overlying the channel region and being insulated therefrom.

2. The power transistor of claim 1, further comprising:
   a sinker region in the semiconductor body such that the sinker region is spaced from the channel region by the source region; and
   a shield overlying but electrically insulated from at least a portion of the gate and at least a portion of the drift region.

3. The power transistor of claim 1, wherein the dopant retarding region is doped with carbon.

4. The power transistor of claim 1, wherein the dopant retarding region is doped with fluorine.

5. The power transistor of claim 1, wherein the dopant retarding region is doped with nitrogen.

6. The power transistor of claim 1, wherein the source and drain regions are doped with arsenic or phosphorous, wherein the channel region is doped with boron, and wherein the semiconductor body comprises monocrystalline silicon.

7. The power transistor of claim 1, wherein dopant retarding region has a dopant concentration of between about $1\times10^{18}$ cm$^{-3}$ and about $1\times10^{21}$ cm$^{-3}$.

8. The power transistor of claim 1, wherein the power transistor comprises a laterally diffused metal oxide semiconductor (LDMOS) device.

9. A laterally diffused metal oxide semiconductor (LDMOS) transistor comprising:
 a source region of a first conductivity type disposed in a semiconductor body;
 a drain region of the first conductivity type disposed in the semiconductor body and spaced from the source region;
 a drift region of the first conductivity type disposed in the semiconductor body adjacent the drain region between the source and drain regions;
 a channel region of a second conductivity type disposed in the semiconductor body adjacent the drift region between the drift region and the source region;
 a dopant retarding region disposed in the semiconductor body between the drift region and the channel region, the dopant retarding region doped with a material selected from the group consisting of carbon, nitrogen and fluorine, wherein either the drift region is bounded by the dopant retarding region and the channel region is not bounded by the dopant retarding region or the channel region is bounded by the dopant retarding region and the drift region is not bounded by the dopant retarding region;
 a gate at least partially overlying the channel region and being insulated therefrom; and
 an asymmetric shield overlying a portion of the gate and a portion of the drift region, wherein the asymmetric shield is electrically insulated from the gate and the drift region, wherein the asymmetric shield is disposed vertically above the dopant retarding region.

10. The LDMOS transistor of claim 9, further comprising:
 a sinker region in the semiconductor body such that the sinker region is spaced from the channel region by the source region.

11. The LDMOS transistor of claim 9, wherein the dopant retarding region is doped with carbon.

12. The LDMOS transistor of claim 9, wherein the dopant retarding region is doped with fluorine.

13. The LDMOS transistor of claim 9, wherein the dopant retarding region is doped with nitrogen.

14. The LDMOS transistor of claim 9, wherein the source and drain regions are doped with arsenic or phosphorous, wherein the channel region is doped with boron, and wherein the semiconductor body comprises monocrystalline silicon.

15. The LDMOS transistor of claim 9, wherein dopant retarding region has a dopant concentration of between about $1\times10^{18}$ cm$^{-3}$ and about $1\times10^{21}$ cm$^{-3}$.

16. The power transistor of claim 1, wherein the drift region is bounded by the dopant retarding region and the channel region is not bounded by the dopant retarding region.

17. The power transistor of claim 1, wherein the channel region is bounded by the dopant retarding region and the drift region is not bounded by the dopant retarding region.

18. The LDMOS transistor of claim 9, wherein the drift region is bounded by the dopant retarding region and the channel region is not bounded by the dopant retarding region.

19. The LDMOS transistor of claim 9, wherein the channel region is bounded by the dopant retarding region and the drift region is not bounded by the dopant retarding region.

* * * * *